(12) United States Patent
Wei et al.

(10) Patent No.: US 11,189,743 B2
(45) Date of Patent: *Nov. 30, 2021

(54) SINGLE PHOTON AVALANCHE DIODE

(71) Applicant: Taiwan Semiconductor Manufacturing Co., Ltd., Hsin-Chu (TW)

(72) Inventors: Chia-Yu Wei, Tainan (TW); Yu-Ting Kao, Hsinchu (TW); Yen-Liang Lin, Tainan (TW); Wen-I Hsu, Tainan (TW); Hsun-Ying Huang, Tainan (TW); Kuo-Cheng Lee, Tainan (TW); Hsin-Chi Chen, Tainan (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/818,934

(22) Filed: Mar. 13, 2020

(65) Prior Publication Data
US 2020/0212244 A1 Jul. 2, 2020

Related U.S. Application Data

(63) Continuation of application No. 16/014,218, filed on Jun. 21, 2018, now Pat. No. 10,629,765.

(60) Provisional application No. 62/526,892, filed on Jun. 29, 2017.

(51) Int. Cl.
*H01L 27/146* (2006.01)
*H01L 31/107* (2006.01)
*H01L 31/0224* (2006.01)
*H01L 31/0216* (2014.01)
*H01L 31/18* (2006.01)
*H01L 31/02* (2006.01)
*H01L 31/0232* (2014.01)
*H01L 31/0352* (2006.01)

(52) U.S. Cl.
CPC ........ *H01L 31/107* (2013.01); *H01L 27/1463* (2013.01); *H01L 27/1464* (2013.01); *H01L 31/02005* (2013.01); *H01L 31/02161* (2013.01); *H01L 31/02164* (2013.01); *H01L 31/02327* (2013.01); *H01L 31/022408* (2013.01); *H01L 31/035272* (2013.01); *H01L 31/1804* (2013.01)

(58) Field of Classification Search
USPC .......................... 257/435, 40, 642–643, 759, 257/E51.001–E51.052, E25.008–E25.009
See application file for complete search history.

(56) References Cited

U.S. PATENT DOCUMENTS

2006/0068586 A1   3/2006 Pain
2014/0291481 A1  10/2014 Zhang
(Continued)

*Primary Examiner* — Niki H Nguyen
(74) *Attorney, Agent, or Firm* — Duane Morris LLP

(57) ABSTRACT

A photodetector includes: a substrate; a first semiconductor region, the first semiconductor region extending into the substrate from a front side of the substrate; and a second semiconductor region, the second semiconductor region further extending into the substrate from a bottom boundary of the first semiconductor region, wherein when the photodetector operates under a Geiger mode, the second semiconductor region is fully depleted to absorb a radiation source received from a back side of the substrate.

19 Claims, 18 Drawing Sheets

(56) References Cited

U.S. PATENT DOCUMENTS

| | | | |
|---|---|---|---|
| 2015/0061063 A1* | 3/2015 | Kim | H01L 27/14605 257/432 |
| 2016/0218236 A1* | 7/2016 | Dhulla | H01L 27/1443 |
| 2017/0317117 A1* | 11/2017 | Ukigaya | H01L 27/1464 |
| 2018/0026147 A1 | 1/2018 | Zhang | |

* cited by examiner

SINGLE PHOTON AVALANCHE DIODE

CROSS-REFERENCE TO RELATED APPLICATIONS

The present application is a continuation of U.S. patent application Ser. No. 16/014,218, filed on Jun. 21, 2018, now U.S. Pat. No. 10,629,765, issued on Apr. 21, 2020, which claims priority to U.S. Provisional Patent Application No. 62/526,892, filed on Jun. 29, 2017, each of which is incorporated by reference herein in its entirety.

BACKGROUND

An avalanche process is typically used in semiconductor devices for photon-sensing applications. In general, the avalanche process can be triggered when a p-n junction is reversely biased under a corresponding breakdown voltage. In particular, to detect light signals with very weak intensities, the p-n junction is biased above the breakdown voltage, which is typically known as operating under a Geiger mode. A photon-sensing device that operates under the Geiger mode is generally known as a single photon avalanche diode (SPAD).

Such SPADs have been widely used in various devices such as, for example, cameras of handheld devices. Although these SPADs have proven useful, there remains room for improvement. For example, a problem suffered by existing SPADs is that their photon detection possibility (PDP) is subjected to a maximum wavelength (e.g., a blue light wavelength), because incident light with longer wavelengths (e.g., a near infra-red (NIR) light wavelength) is typically blocked by a plurality of interconnection layers (e.g., metal/dielectric layers) formed above the active regions of the existing SPADs. Thus, existing SPADs are not entirely satisfactory.

BRIEF DESCRIPTION OF THE DRAWINGS

Aspects of the present disclosure are best understood from the following detailed description when read with the accompanying figures. It is noted that various features are not necessarily drawn to scale. In fact, the dimensions and geometries of the various features may be arbitrarily increased or reduced for clarity of discussion.

DETAILED DESCRIPTION OF EXEMPLARY EMBODIMENTS

The following disclosure describes various exemplary embodiments for implementing different features of the subject matter. Specific examples of components and arrangements are described below to simplify the present disclosure. These are, of course, merely examples and are not intended to be limiting. For example, it will be understood that when an element is referred to as being "connected to" or "coupled to" another element, it may be directly connected to or coupled to the other element, or one or more intervening elements may be present.

The present disclosure provides various embodiments of a photon-sensing device (e.g., a photodetector) that includes a first semiconductor region of a first doping type and a second semiconductor region of a second doping type (different from the first doping type) that respectively extend into a substrate from its front side. The first and second semiconductor regions thus form a p-n junction within the substrate. In some embodiments, the p-n junction is reversely biased above a respective breakdown voltage, which causes the photodetector to operate under the Geiger mode to absorb (e.g., sense) a radiation resource. Further, in some embodiments, under the Geiger mode, the second semiconductor region of the disclosed photodetector is configured to be fully depleted to absorb the radiation resource received from a back side of the substrate. As such, the second semiconductor region may serve as an active region of the disclosed photodetector, and such an active region can receive any radiation resource incident through the back side of the substrate, i.e., without any interconnection layers blocked above the active region. Thus, the above-mentioned issues observed in existing SPADs may be advantageously eliminated.

Figure 1A:
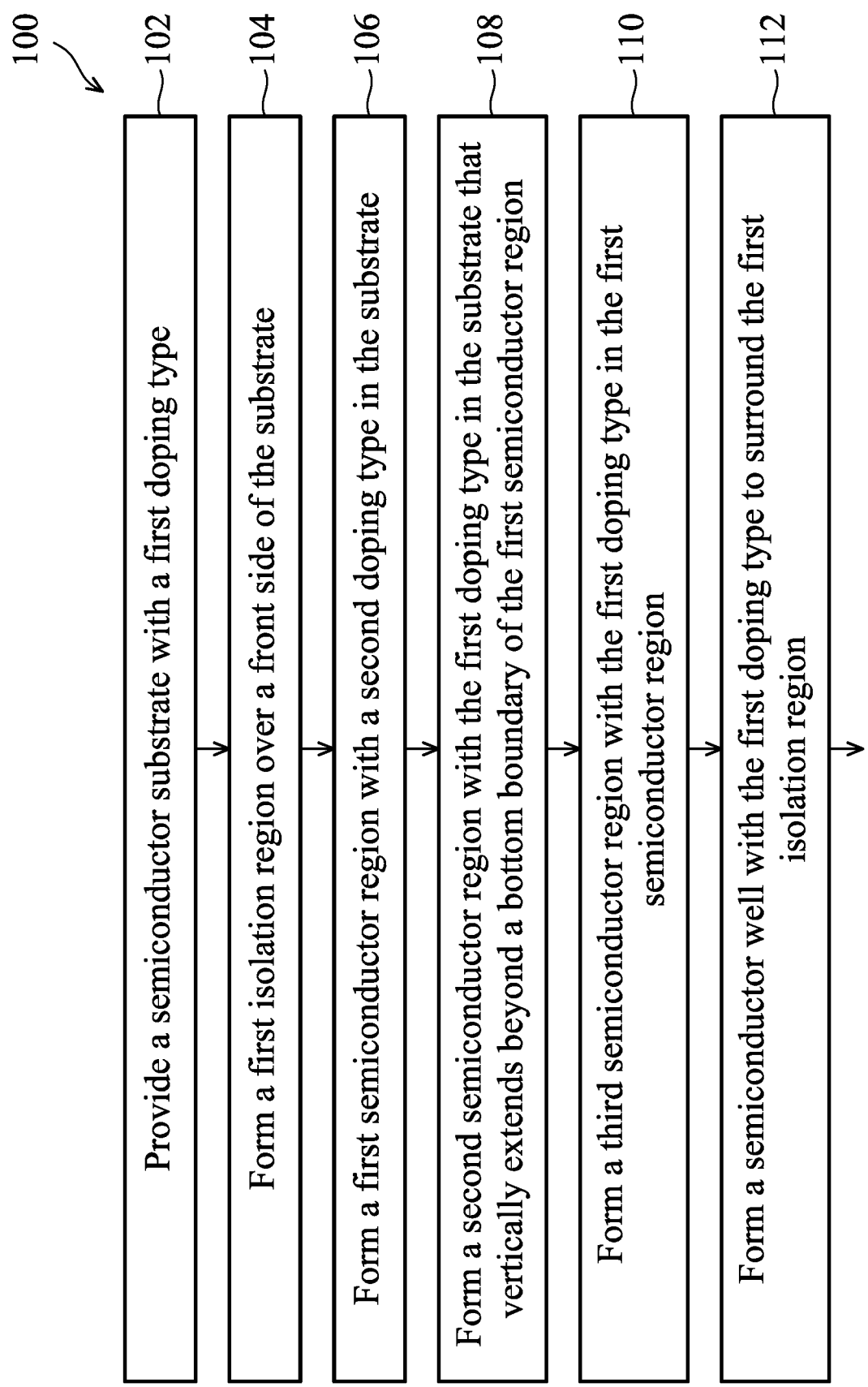
FIGS. 1A, 1B, and 1C illustrate a flow chart of an exemplary method for forming a photodetector, in accordance with some embodiments.
Figure 1B:
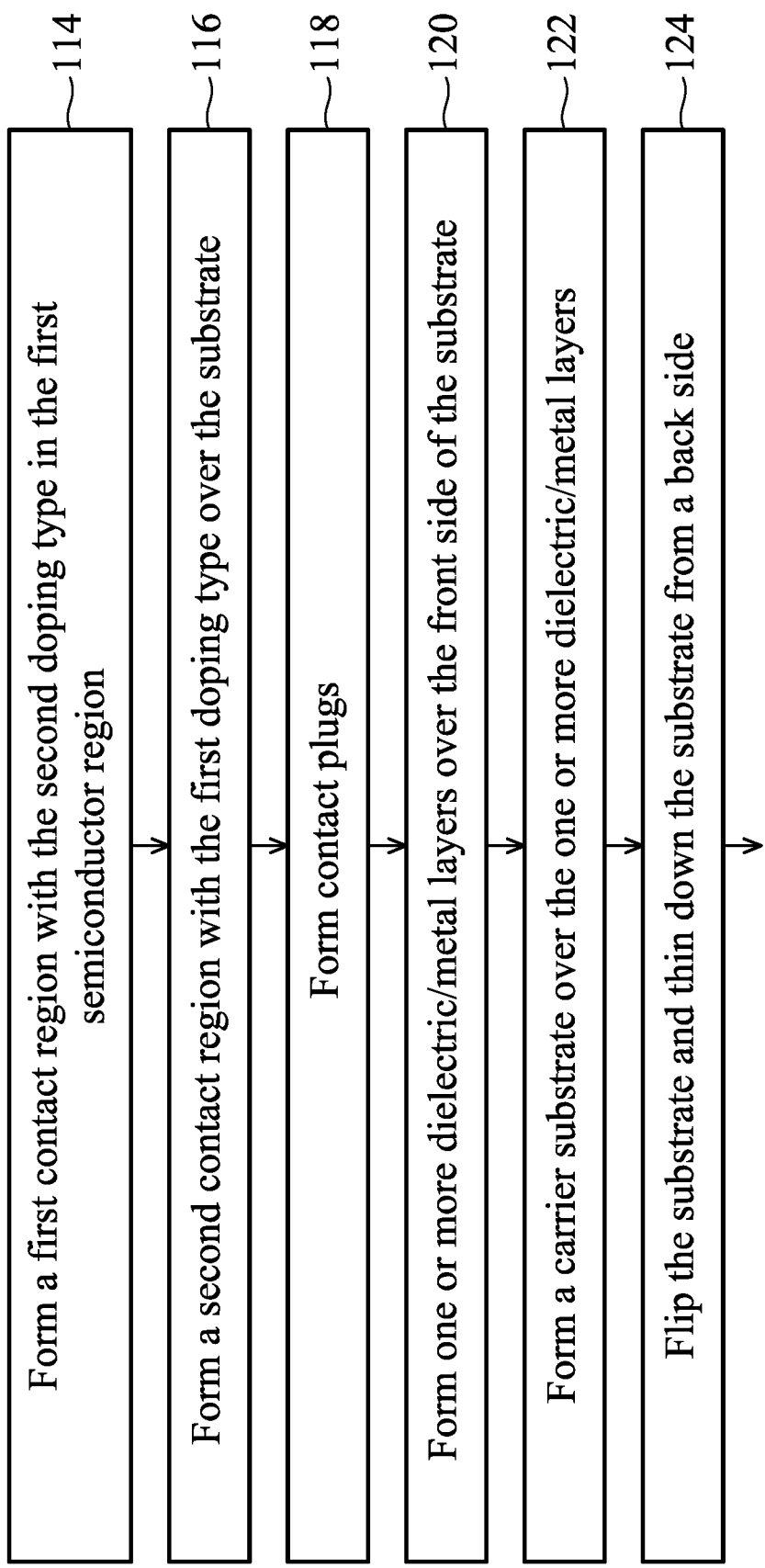
Figure 1C:
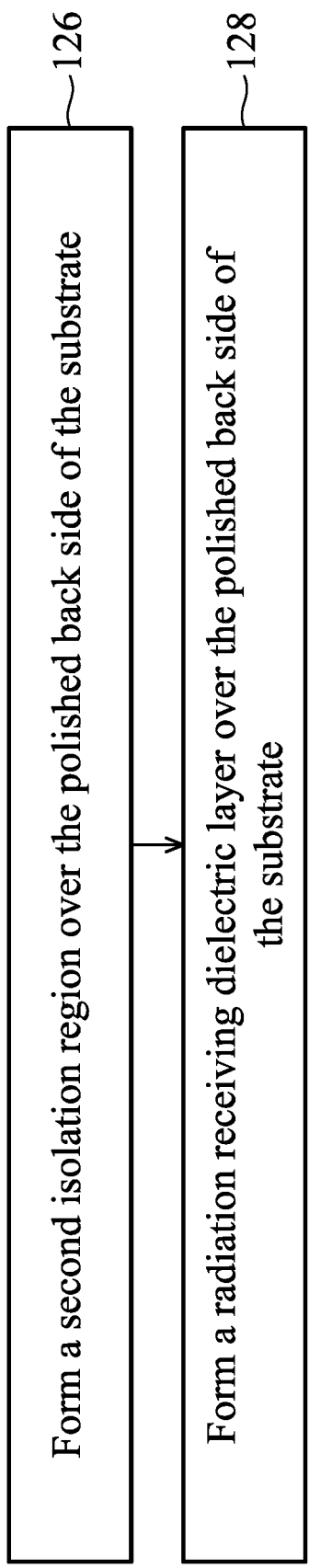

FIGS. 1A, 1B, and 1C illustrate a flowchart of a method 100 to form a photodetector according to one or more embodiments of the present disclosure. It is noted that the method 100 is merely an example, and is not intended to limit the present disclosure. Accordingly, it is understood that additional operations may be provided before, during, and after the method 100 of FIGS. 1A-1C, and that some other operations may only be briefly described herein.

Referring first to FIG. 1A, in some embodiments, the method 100 starts with operation 102 in which a semiconductor substrate with a first doping type is provided. The method 100 continues to operation 104 in which a first isolation region is formed over a front side of the semiconductor substrate. In some embodiments, the first isolation region may include a shallow trench isolation (STI) feature that is configured to surround a respective pixel of the photodetector, as will be discussed in further detail below. The method 100 continues to operation 106 in which a first semiconductor region with a second doping type is formed in the semiconductor substrate. For example, the first doping type may be a p-type, and the second doping type may be an n-type. In some embodiments, the second doping type is different from the first doping type. Further, in some embodiments, the first semiconductor region is formed to inwardly extend into the semiconductor substrate from its front side.

Next, the method 100 continues to operation 108 in which a second semiconductor region with the first doping type is formed in the substrate, wherein the second semiconductor region vertically extends beyond a bottom boundary of the first semiconductor region. As such, in some embodiments, a p-n junction is formed around the bottom boundary of the first semiconductor region. The method 100 continues to operation 110 in which a third semiconductor region with the first doping type in the first semiconductor region. In some embodiments, the third semiconductor region may be formed along a top boundary of the first semiconductor region, and extend inwardly into the first semiconductor region by a substantially shallow depth (e.g., about 1 μm) when compared to a depth of the first semiconductor region (e.g., about 2 μm). In some embodiments, the third semiconductor region, with the first doping type, may have a doping concentration substantially higher than the second semiconductor region that is also with the first doping type, which allows the third semiconductor region to provide an isolation functionality for the photodetector. The method 100 continues to operation 112 in which a semiconductor well with the first doping type is formed to surround the first isolation feature. Accordingly, in some embodiments, the semiconductor well may also surround the pixel of the photodetector.

Referring then to FIG. 1B, the method 100 continues to operation 114 in which a first contact region with the second doping type is formed in the first semiconductor region. In some embodiments, the first contact region, with the second doping type, may have a doping concentration substantially higher than the first semiconductor region that is also with the second doping type, which allows the first contact region to be more conductive thereby causing a respective contact plug to electrically couple the first semiconductor region through the first contact region. The method 100 continues to operation 116 in which a second contact region with the first doping type is formed over the substrate. In some embodiments, the second contact region, with the first doping type, may have a doping concentration substantially higher than the substrate that is also with the first doping type, which causes the second contact region to be more conductive thereby causing a respective contact plug to electrically couple the substrate and the second semiconductor region through the second contact region. In some embodiments, the second contact region may be optional. As such, the substrate may be directly coupled to the contact plug. The method 100 continues to operation 118 in which respective contact plugs are formed. As mentioned above, the contact plugs are formed to couple the first semiconductor region and the substrate/second semiconductor region through the first and second contact regions, respectively. For example, when the substrate and the second semiconductor region are doped with p-type dopants and the first semiconductor region is doped with n-type dopants, the contact plug connecting the first contact region is typically referred to as a "cathode," and the contact plug connecting the second contact region is typically referred to as an "anode."

Next, the method 100 continues to operation 120 in which one or more dielectric/metal layers are formed over the front side of the substrate. Such a dielectric/metal layer is also referred to as an "interconnection layer." In some embodiments, within at least one of the one or more dielectric/metal layers, a conductive reflection layer may be formed directly above the first semiconductor region. The method 100 continues to operation 122 in which a carrier substrate is formed over the one or more dielectric/metal layers. The method 100 continues to operation 124 in which the substrate is flipped and the substrate is thinned down from a respective back side. In some embodiments, a chemical-mechanical polishing (CMP) technique may be used to thin down (e.g., polish) the substrate. In some embodiments, subsequently to the thinning down process, a radiation-receiving surface may be formed on the polished back side of the substrate.

Referring then to FIG. 1C, the method 100 continues to operation 126 in which a second isolation region is formed over the polished back side of the substrate. In some embodiments, the second isolation region is formed to inwardly extend into the substrate from the polished back side of the substrate. In some embodiments, the second isolation region may include a deep trench isolation (DTI) feature that is configured to surround the pixel of the photodetector, in particular, to confine an incident radiation source to the second semiconductor region. The method 100 continues to operation 126 in which a radiation-receiving dielectric layer is formed over the radiation-receiving surface. In some embodiments, the radiation-receiving dielectric layer may be formed of silicon oxide with a substantially thin thickness (e.g., about 100~300 nanometers (nm)) so as to allow the radiation source to transmit therethrough.

Figure 2A:
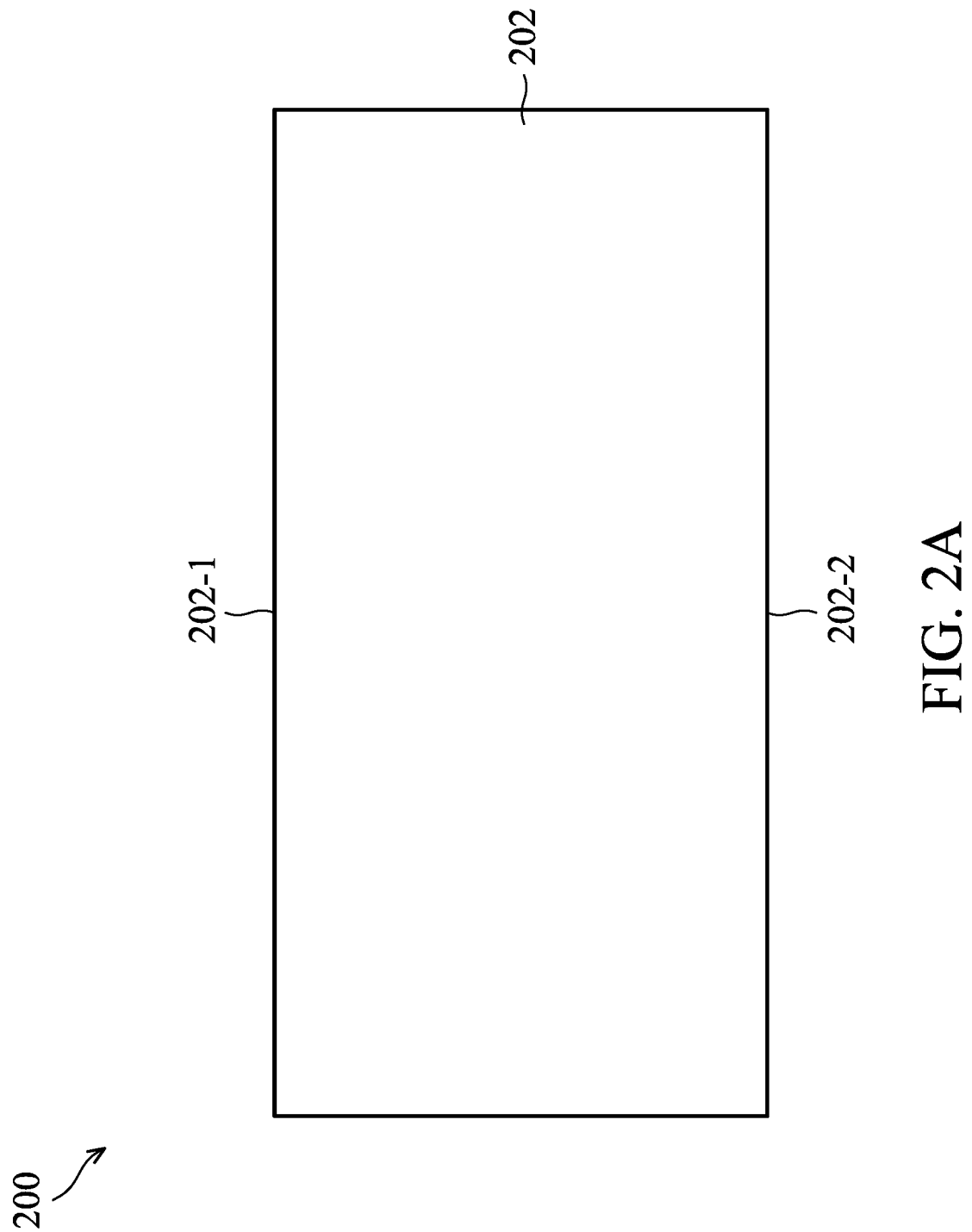
FIGS. 2A, 2B, 2C, 2D, 2E, 2F, 2G, 2H, 2I, 2J, 2K, 2L, 2M, and 2N illustrate cross-sectional views of an exemplary photodetector device during various fabrication stages, made by the method of FIGS. 1A, 1B, and 1C, in accordance with some embodiments.

In some embodiments, operations of the method 100 may be associated with cross-sectional views of a photodetector 200 at various fabrication stages as shown in FIGS. 2A, 2B, 2C, 2D, 2E, 2F, 2G, 2H, 2I, 2J, 2K, 2L, 2M, and 2N, respectively. The photodetector 200 may be included in a microprocessor, memory cell, and/or other integrated circuit (IC). Also, FIGS. 2A through 2N are simplified for a better understanding of the concepts of the present disclosure. For example, although the figures illustrate the photodetector 200, it is understood the IC may comprise a number of other devices such as resistors, capacitors, inductors, fuses, etc., which are not shown in FIGS. 2A-2N, for purposes of clarity of illustration.

Corresponding to the operation 102 of FIG. 1A, FIG. 2A is a cross-sectional view of the photodetector 200 including a semiconductor substrate 202 having a front side 202-1 and a back side 202-2 at one of the various stages of fabrication, in accordance with some embodiments. The substrate 202 includes a silicon substrate having a first doping type of dopants (e.g., p-type dopants such as boron), in which case the substrate 202 is a p-type substrate. In some other embodiments, the substrate 202 may include another suitable semiconductor material. For example, the substrate 202 may be a silicon substrate having a second doping type of dopants (e.g., n-type dopants such as phosphorous or arsenic), in which case the substrate 202 is an n-type substrate. Still in some other embodiments, the substrate 202 may include other elementary semiconductors such as germanium and diamond. The substrate 202 may optionally include a compound semiconductor and/or an alloy semiconductor. Further, in some alternative embodiments, the substrate 202 may include an epitaxial layer (epi layer), may be strained for performance enhancement, and may include a silicon-on-insulator (SOI) structure. For purposes of clarity of illustration, in the following discussions of the photodetector 200 with respect to FIGS. 2A-2N, the dopants with the first doping type and the second doping type are respectively referred to as the dopants with "p-type" and "n-type."

In some embodiments, the substrate 202 includes various regions such as, for example, a pixel-array region, a periphery region, a bonding pad region, and a scribe line region, etc. For simplicity, only the pixel-array region will be illustrated and described in the following discussions. In general, the pixel-array region is where arrays of radiation-sensing pixels/devices are to be formed. The periphery region is where non-radiation-sensing devices are formed, such as digital devices or control devices.

Figure 2B:
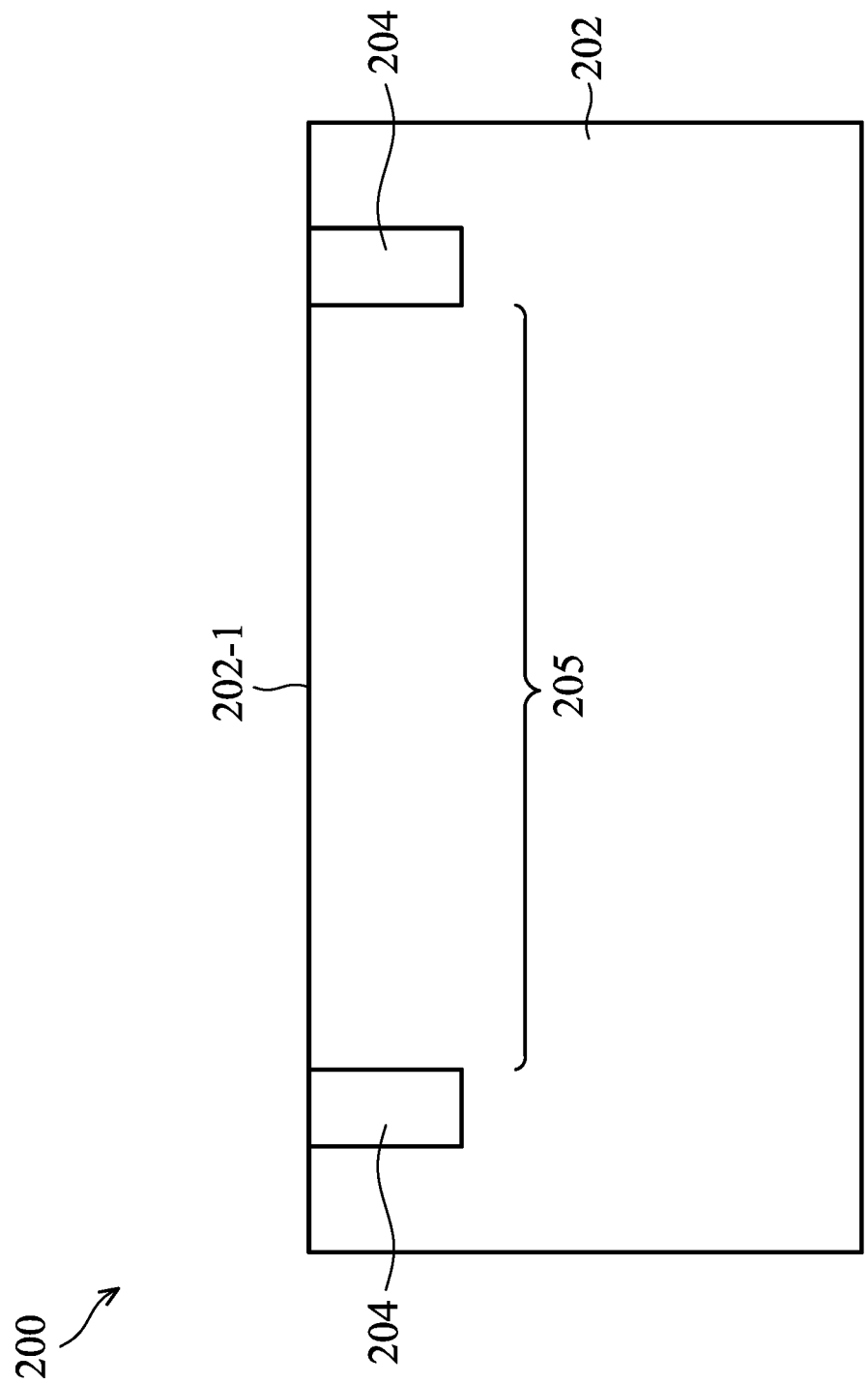

Corresponding to the operation 104 of FIG. 1A, FIG. 2B is a cross-sectional view of the photodetector 200 including a first isolation region 204, which is formed at one of the various stages of fabrication, in accordance with some embodiments. As shown, the first isolation region 204 is formed to extend inwardly into the substrate 202 from the front side 202-1. In some embodiments, when viewing from the top, the first isolation region 204 may be formed of a ring-like structure to surround a portion 205 of the substrate 202, wherein such a portion 205 of the substrate 202 may be used to form a single pixel of the photodetector 200. As mentioned above, the first isolation region 204 may include a shallow trench isolation (STI) feature, according to some embodiments.

In some embodiments, the first isolation region (STI) 204 may be formed by performing at least some of the following processes: using chemical vapor deposition (CVD), physical vapor deposition (PVD), spin-on coating, and/or other suitable techniques to deposit one or more removable layers (e.g., a photoresist layer, a hardmask layer, etc.) over the front side 202-1 of the substrate 202; performing one or more patterning processes (e.g., a lithography process, a dry/wet etching process, a cleaning process, a soft/hard baking process, etc.) to form an opening through the one or more removable layers; using one or more (dry and/or wet) etching processes with the patterned removable layer(s) serving as a mask to recess an upper portion of the substrate 202; and using CVD, PVD, and/or other suitable techniques to refill the recessed upper portion of the substrate 202 with oxide materials (e.g., silicon oxide).

Figure 2C:
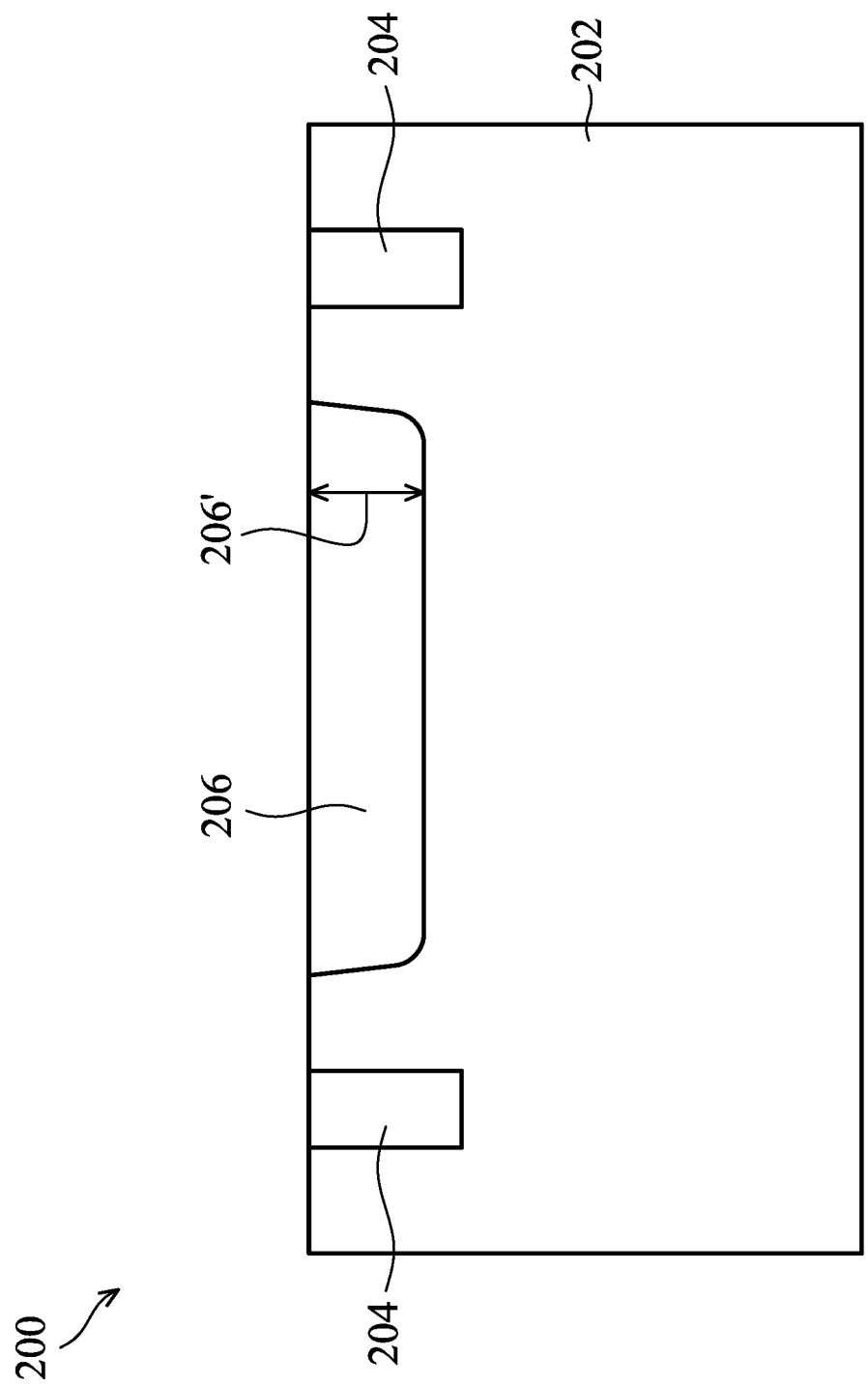

Corresponding to the operation 106 of FIG. 1A, FIG. 2C is a cross-sectional view of the photodetector 200 including a first semiconductor region 206, which is formed at one of the various stages of fabrication, in accordance with some embodiments. As shown, the first semiconductor region 206 is formed to extend inwardly into the substrate 202 from the front side 202-1, and with a depth 206' that is about 2 μm. In some embodiments, the first semiconductor region 206 is doped with the second doping type (n-type), which is opposite to the doping type of the substrate 202.

In some embodiments, the first semiconductor region 206 may be formed by at least some of the following processes: using chemical vapor deposition (CVD), physical vapor deposition (PVD), spin-on coating, and/or other suitable techniques to deposit a removable layer (e.g., a photoresist layer, a hardmask layer, etc.) over the substrate 202; performing one or more patterning processes (e.g., a lithography process, a dry/wet etching process, a cleaning process, a soft/hard baking process, etc.) to form an opening through the removable layer, wherein the opening is confined by the first isolation region 204; with the patterned removable layer serving as a mask, performing a doping process (e.g., an ion implantation process, a diffusion process, etc.) to incorporate a plurality of dopants with the second doping type (n-type) into the substrate 202; removing the removable layer; and performing an optional annealing process to activate the incorporated dopants.

Figure 2D:
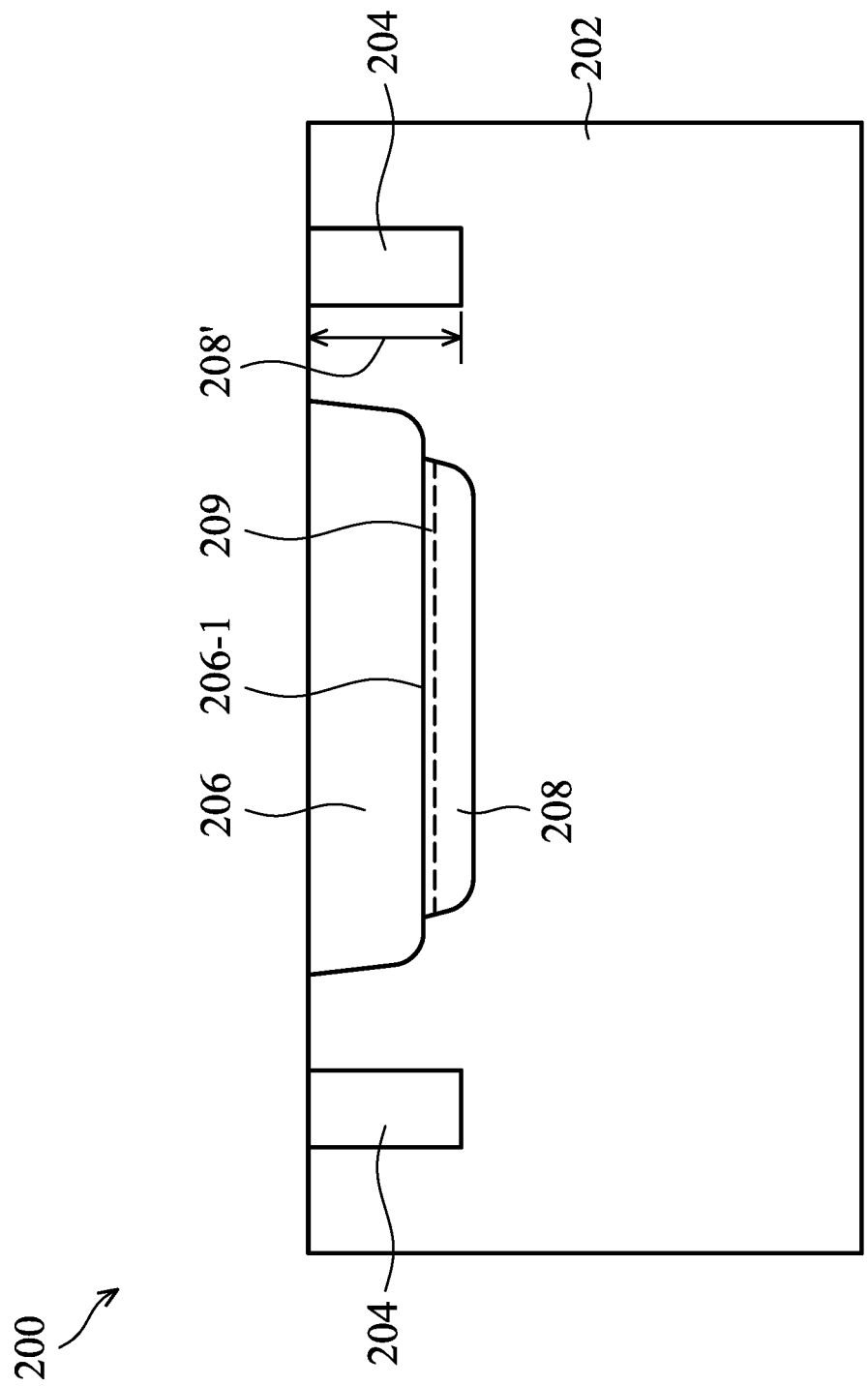

Corresponding to the operation 108 of FIG. 1A, FIG. 2D is a cross-sectional view of the photodetector 200 including a second semiconductor region 208, which is formed at one of the various stages of fabrication, in accordance with some embodiments. As shown, the second semiconductor region 208 is formed to further extend inwardly into the substrate 202 with a depth 208' that is about 3 μm, and more specifically, the second semiconductor region 208 vertically extends beyond a bottom boundary 206-1 of the first semiconductor region 206. In some embodiments, the second semiconductor region 208 is doped with the first doping type (p-type), which is opposite to the doping type of the first semiconductor region 206. As such, in some embodiments, a p-n junction is formed around the bottom boundary 206-1 of the first semiconductor region 206. In some other embodiments, while forming the second semiconductor region 208, an intrinsic (i.e., not intentionally doped) layer 209 may be formed between the first semiconductor region 206 and the semiconductor region 208.

In some embodiments, the second semiconductor region 208 may be formed by at least some of the following processes: using chemical vapor deposition (CVD), physical vapor deposition (PVD), spin-on coating, and/or other suitable techniques to deposit a removable layer (e.g., a photoresist layer, a hardmask layer, etc.) over the substrate 202; performing one or more patterning processes (e.g., a lithography process, a dry/wet etching process, a cleaning process, a soft/hard baking process, etc.) to form an opening through the removable layer, wherein the opening is aligned with the first semiconductor region 206 (e.g., laterally confined within an area defined by the first semiconductor region 206); with the patterned removable layer serving as a mask, performing a doping process (e.g., an ion implantation process, a diffusion process, etc.) to incorporate a plurality of dopants with the first doping type (p-type) extending through the first semiconductor region 206 and into the substrate 202; removing the removable layer; and performing an optional annealing process to activate the incorporated dopants.

Figure 2E:
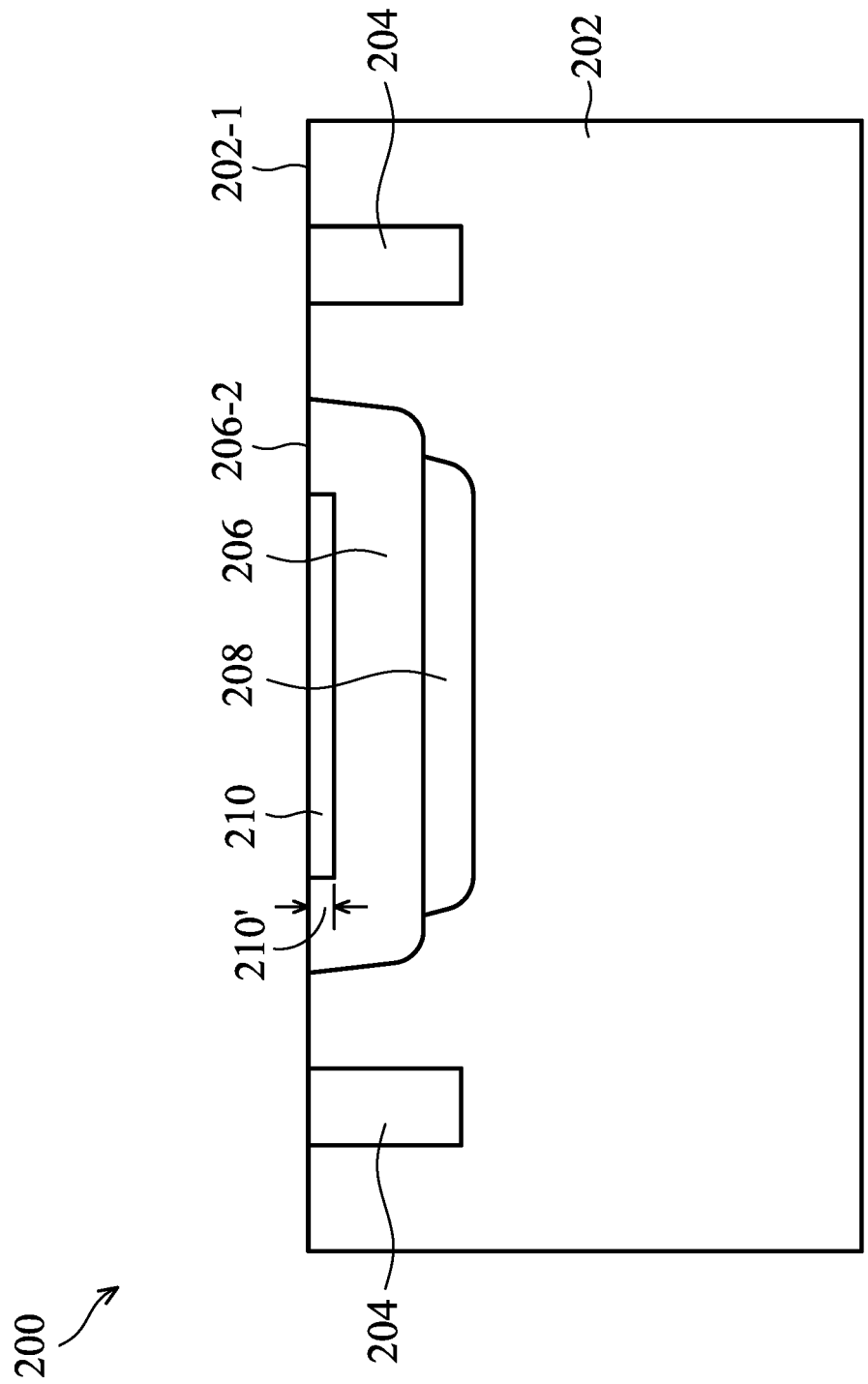

Corresponding to the operation 110 of FIG. 1A, FIG. 2E is a cross-sectional view of the photodetector 200 including a third semiconductor region 210, which is formed at one of the various stages of fabrication, in accordance with some embodiments. As shown, the third semiconductor region 210 is formed along a top boundary 206-2 of the first semiconductor region 206 (also the front side 202-1 of the substrate 202), and extends inwardly into the first semiconductor region 206 by a depth 210' that is about 1 μm. In some embodiments, similar to the second semiconductor region 208, the third semiconductor region 210 is also doped with the first doping type (p-type) but in an elevated concentration. As such, the third semiconductor region 210 may be configured to provide an isolation feature to the first semiconductor region 206, according to some embodiments.

In some embodiments, the third semiconductor region 210 may be formed by at least some of the following processes: using chemical vapor deposition (CVD), physical vapor deposition (PVD), spin-on coating, and/or other suitable techniques to deposit a removable layer (e.g., a photoresist layer, a hardmask layer, etc.) over the substrate 202; performing one or more patterning processes (e.g., a lithography process, a dry/wet etching process, a cleaning process, a soft/hard baking process, etc.) to form an opening through the removable layer, wherein the opening is aligned with the first semiconductor region 206 (e.g., laterally confined within the area defined by the first semiconductor region 206); with the patterned removable layer serving as a mask, performing a doping process (e.g., an ion implantation process, a diffusion process, etc.) to incorporate a plurality of dopants with the first doping type (p-type) into the first semiconductor region 206; removing the removable layer; and performing an optional annealing process to activate the incorporated dopants.

Figure 2F:
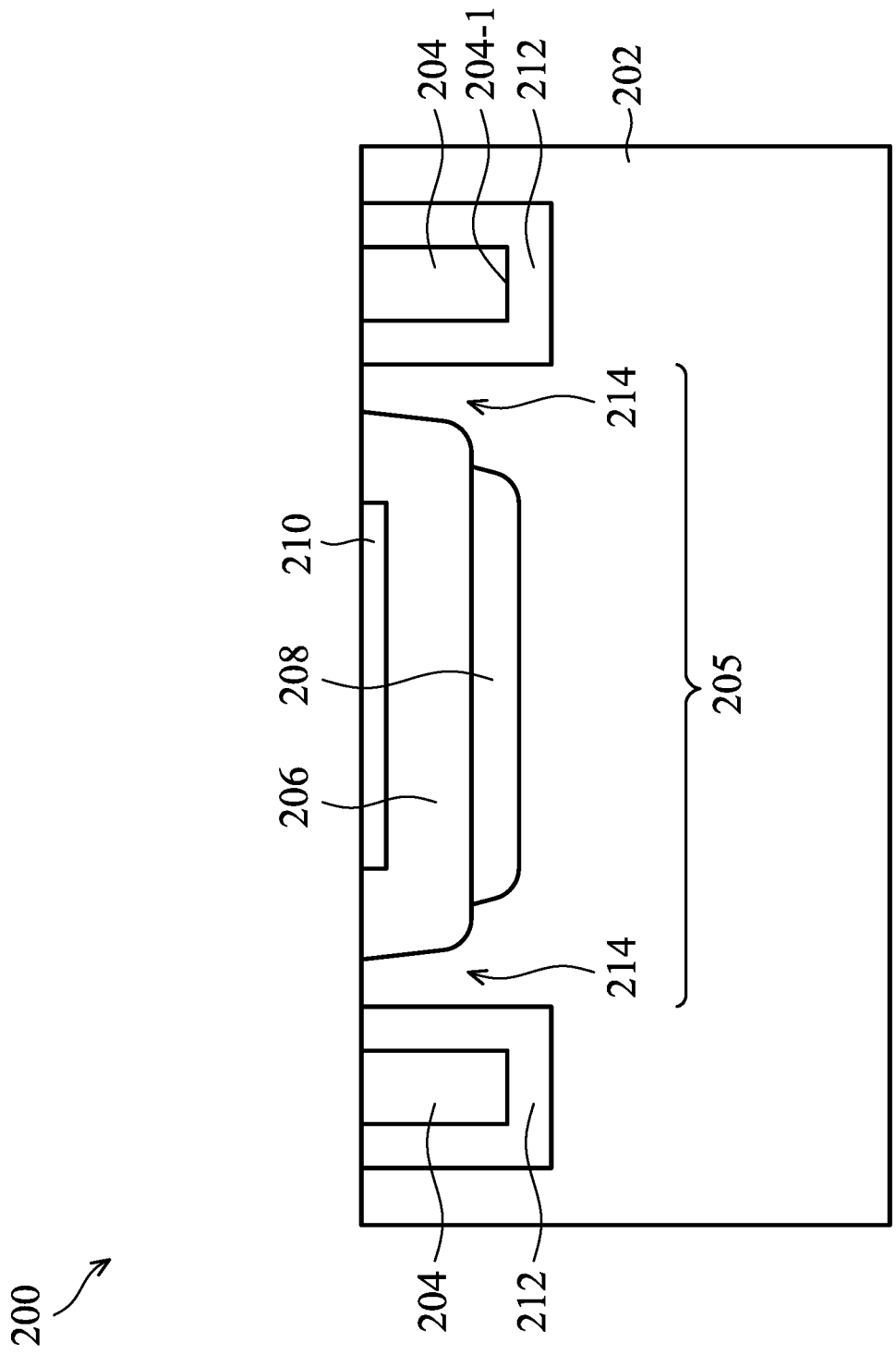

Corresponding to the operation 112 of FIG. 1A, FIG. 2F is a cross-sectional view of the photodetector 200 including a semiconductor well 212, which is formed at one of the various stages of fabrication, in accordance with some embodiments. As shown, the semiconductor well 212 is formed to surround the first isolation region 204. In other words, the semiconductor well 212 further extends inwardly into the substrate 202 from a lower boundary 204-1 of the first isolation region 204. As such, the semiconductor well 212 may be also formed as a ring-like structure surrounding the pixel 205. In some embodiments, after the semiconductor well 212 is formed, when viewing from the top, a portion 214 of the substrate 202 is not subsequently formed as any semiconductor region (e.g., 206, 208, 210, etc.). Such a portion 214 is typically referred to as a guard ring of the pixel 205. In some embodiments, the semiconductor well 212 may be doped with the first doping type (p-type).

In some embodiments, the semiconductor well 212 may be formed by at least some of the following processes: using chemical vapor deposition (CVD), physical vapor deposition (PVD), spin-on coating, and/or other suitable techniques to deposit a removable layer (e.g., a photoresist layer, a hardmask layer, etc.) over the substrate 202; performing one or more patterning processes (e.g., a lithography process, a dry/wet etching process, a cleaning process, a soft/hard baking process, etc.) to form an opening through the removable layer, wherein the opening is aligned with the first isolation region 204 and overlays the first semiconductor region 206; with the patterned removable layer serving as a mask, performing a doping process (e.g., an ion implantation process, a diffusion process, etc.) to incorporate a plurality of dopants with the first doping type (p-type) into the substrate 202; removing the removable layer; and performing an optional annealing process to activate the incorporated dopants.

Figure 2G:
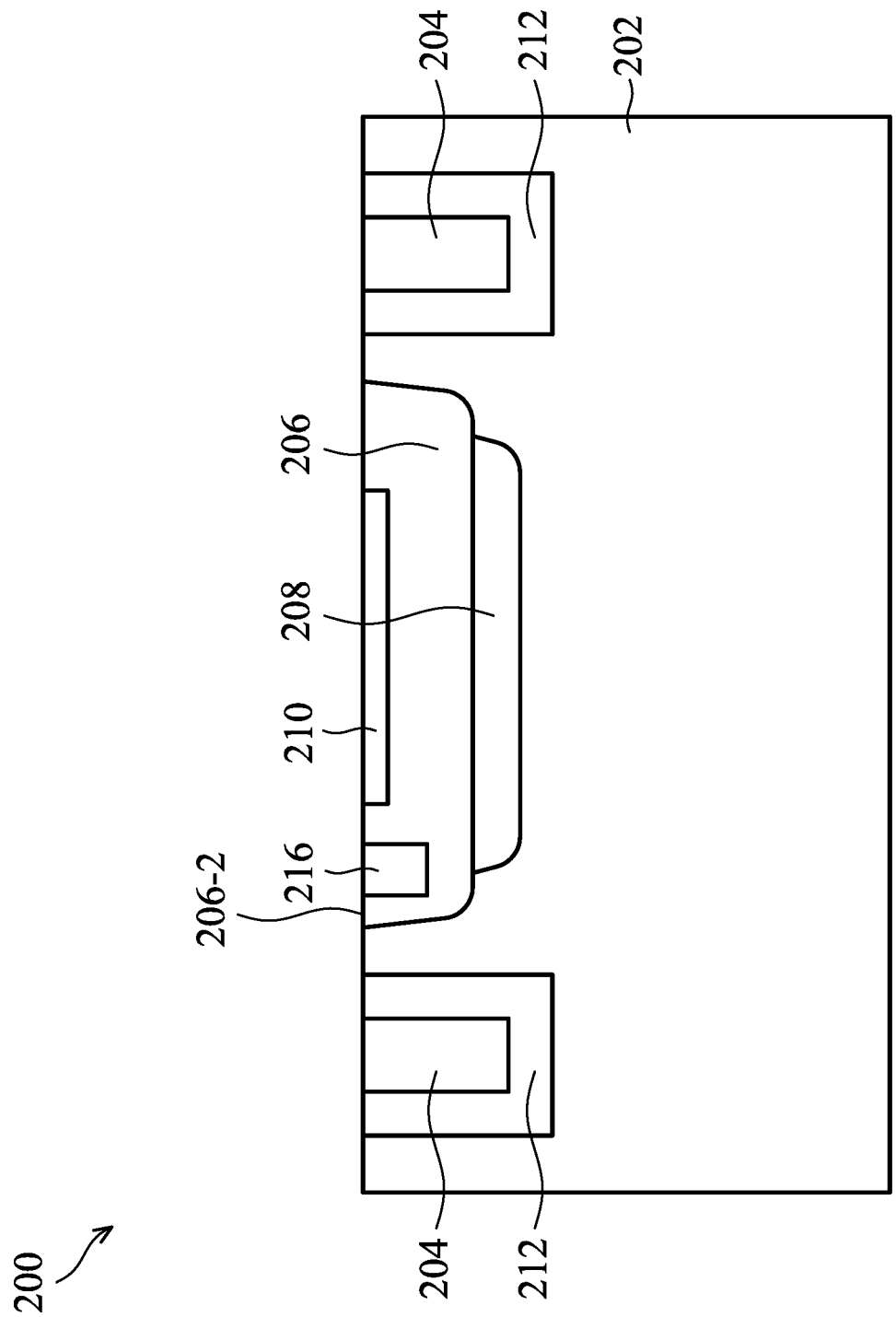

Corresponding to the operation 114 of FIG. 1B, FIG. 2G is a cross-sectional view of the photodetector 200 including a first contact region 216, which is formed at one of the various stages of fabrication, in accordance with some embodiments. As shown, the first contact region 216 is formed in the first semiconductor region 206, along the top boundary 206-2 of the first semiconductor region 206, and laterally adjacent to the third semiconductor region 210. In some embodiments, similar to the first semiconductor region 206, the first contact region 216 is also doped with the second doping type (n-type) but in an elevated concentration. As such, the first contact region 216 may provide the first semiconductor region 260 with a more conductive connection path.

In some embodiments, the first contact region 216 may be formed by at least some of the following processes: using chemical vapor deposition (CVD), physical vapor deposition (PVD), spin-on coating, and/or other suitable techniques to deposit a removable layer (e.g., a photoresist layer, a hardmask layer, etc.) over the substrate 202; performing one or more patterning processes (e.g., a lithography process, a dry/wet etching process, a cleaning process, a soft/hard baking process, etc.) to form an opening through the removable layer, wherein the opening is aligned with the area where the first contact region 216 is intended to be formed; with the patterned removable layer serving as a mask, performing a doping process (e.g., an ion implantation process, a diffusion process, etc.) to incorporate a plurality of dopants with the second doping type (n-type) into the first semiconductor region 206; removing the removable layer; and performing an optional annealing process to activate the incorporated dopants.

Figure 2H:
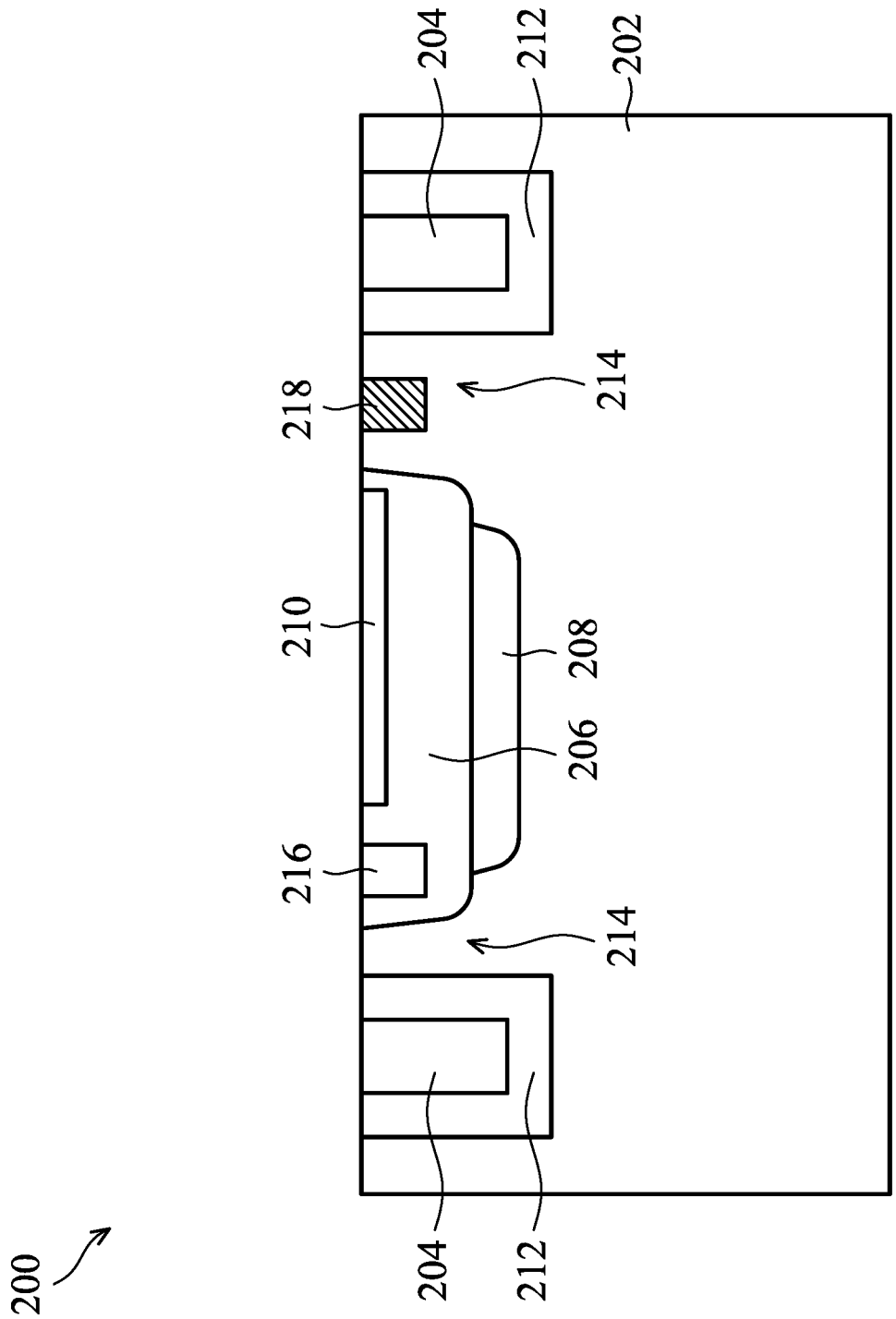

Corresponding to the operation 116 of FIG. 1B, FIG. 2H is a cross-sectional view of the photodetector 200 including a second contact region 218, which is formed at one of the various stages of fabrication, in accordance with some embodiments. As shown, the second contact region 218 is formed in the guard ring 214 (i.e., within the substrate 202), and laterally between the first semiconductor region 206 and at least one side of the semiconductor well 212. In some embodiments, similar to the substrate 202, the second contact region 218 is also doped with the first doping type (p-type) but in an elevated concentration. As such, the second contact region 218 may provide the substrate 202 with a more conductive connection path.

In some embodiments, the second contact region 218 may be formed by at least some of the following processes: using chemical vapor deposition (CVD), physical vapor deposition (PVD), spin-on coating, and/or other suitable techniques to deposit a removable layer (e.g., a photoresist layer, a hardmask layer, etc.) over the substrate 202; performing one or more patterning processes (e.g., a lithography process, a dry/wet etching process, a cleaning process, a soft/hard baking process, etc.) to form an opening through the removable layer, wherein the opening is aligned with the area where the second contact region 218 is intended to be formed; with the patterned removable layer serving as a mask, performing a doping process (e.g., an ion implantation process, a diffusion process, etc.) to incorporate a plurality of dopants with the second doping type (n-type) into the substrate 202 (the guard ring 214); removing the removable layer; and performing an optional annealing process to activate the incorporated dopants.

Figure 2I:
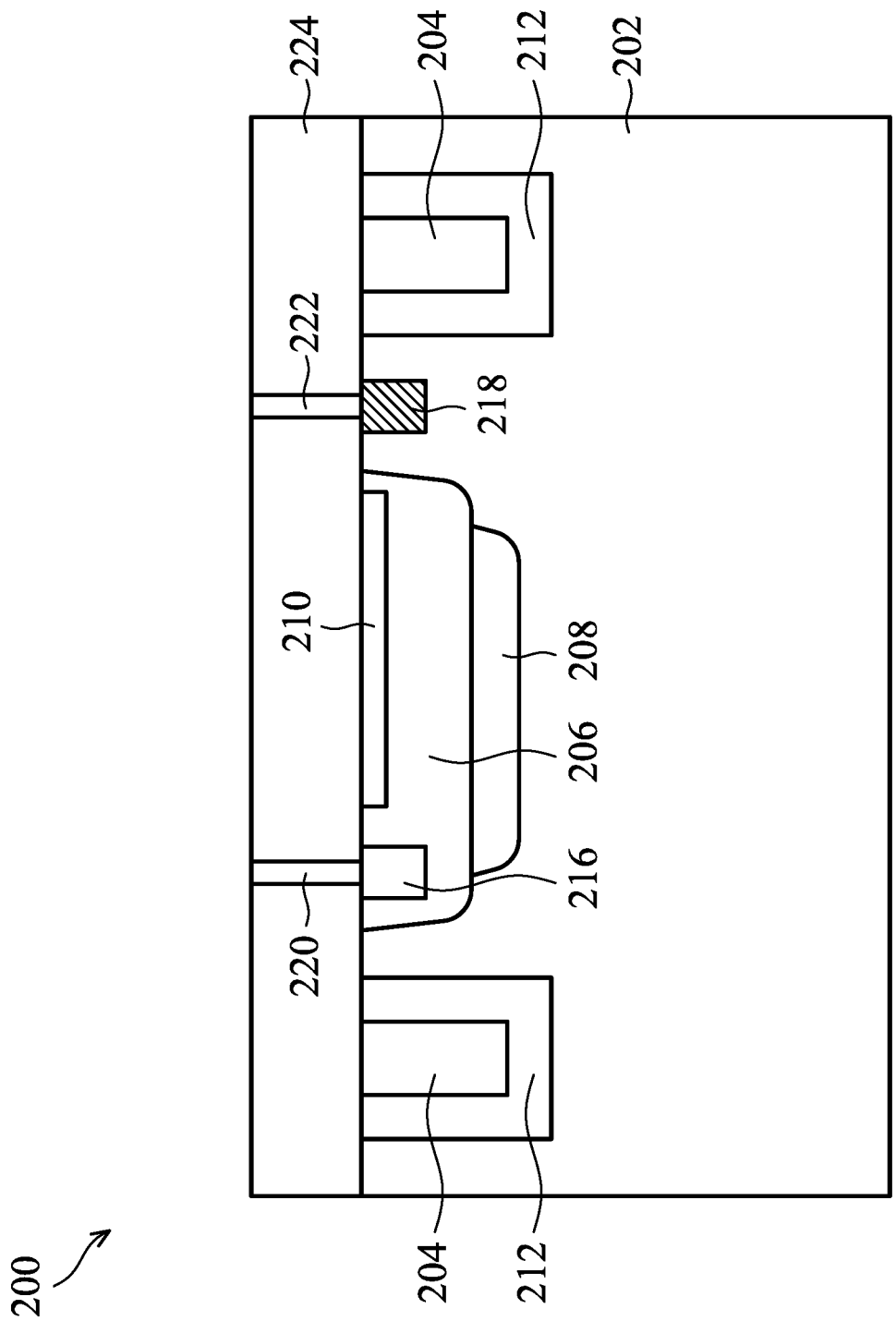

Corresponding to the operation 118 of FIG. 1B, FIG. 2I is a cross-sectional view of the photodetector 200 including contact plugs 220 and 222, which are formed at one of the various stages of fabrication, in accordance with some embodiments. As shown, the contact plugs 220 and 222 both extend through a dielectric layer 224 formed over the substrate 202, and the contact plugs 220 and 222 are coupled to the first contact region 216 and the second contact region 218, respectively. In some embodiments, the contact plugs 220 and 222 may each include a via structure, which is typically known as a "via 0."

In some embodiments, the contact plugs 220 and 222 are each formed of a metal material, e.g., copper (Cu), aluminum (Al), tungsten (W), zinc (Zn), gold (Au), and alloys made thereof. In some embodiments, the dielectric layer 224 is formed of at least one material selected from the following: silicon oxide, a low dielectric constant (low-k) material, other suitable dielectric material, or a combination thereof. The low-k material may include fluorinated silica glass (FSG), phosphosilicate glass (PSG), borophosphosilicate glass (BPSG), carbon doped silicon oxide ($SiO_xC_y$), strontium oxide (SrO), Black Diamond® (Applied Materials of Santa Clara, Calif.), Xerogel, Aerogel, amorphous fluorinated carbon, Parylene, BCB (bis-benzocyclobutenes), SiLK (Dow Chemical, Midland, Mich.), polyimide, and/or other future developed low-k dielectric materials.

In some embodiments, the contact plugs 220 and 222 may be formed by at least some of the following processes: using chemical vapor deposition (CVD), physical vapor deposition (PVD), spin-on coating, and/or other suitable techniques to deposit the above-described dielectric material of the dielectric layer 224 over the substrate 202; performing one or more patterning processes (e.g., a lithography process, a dry/wet etching process, a cleaning process, a soft/hard baking process, etc.) to form openings through the dielectric material, wherein the openings are respectively aligned with the areas where the first and second contact plugs 220 and 222 are intended to be formed; using CVD, PVD, E-gun, and/or other suitable techniques to deposit the above-described metal material to refill the openings; and polishing out excessive metal material to form the contact plugs 220 and 222.

Figure 2J:
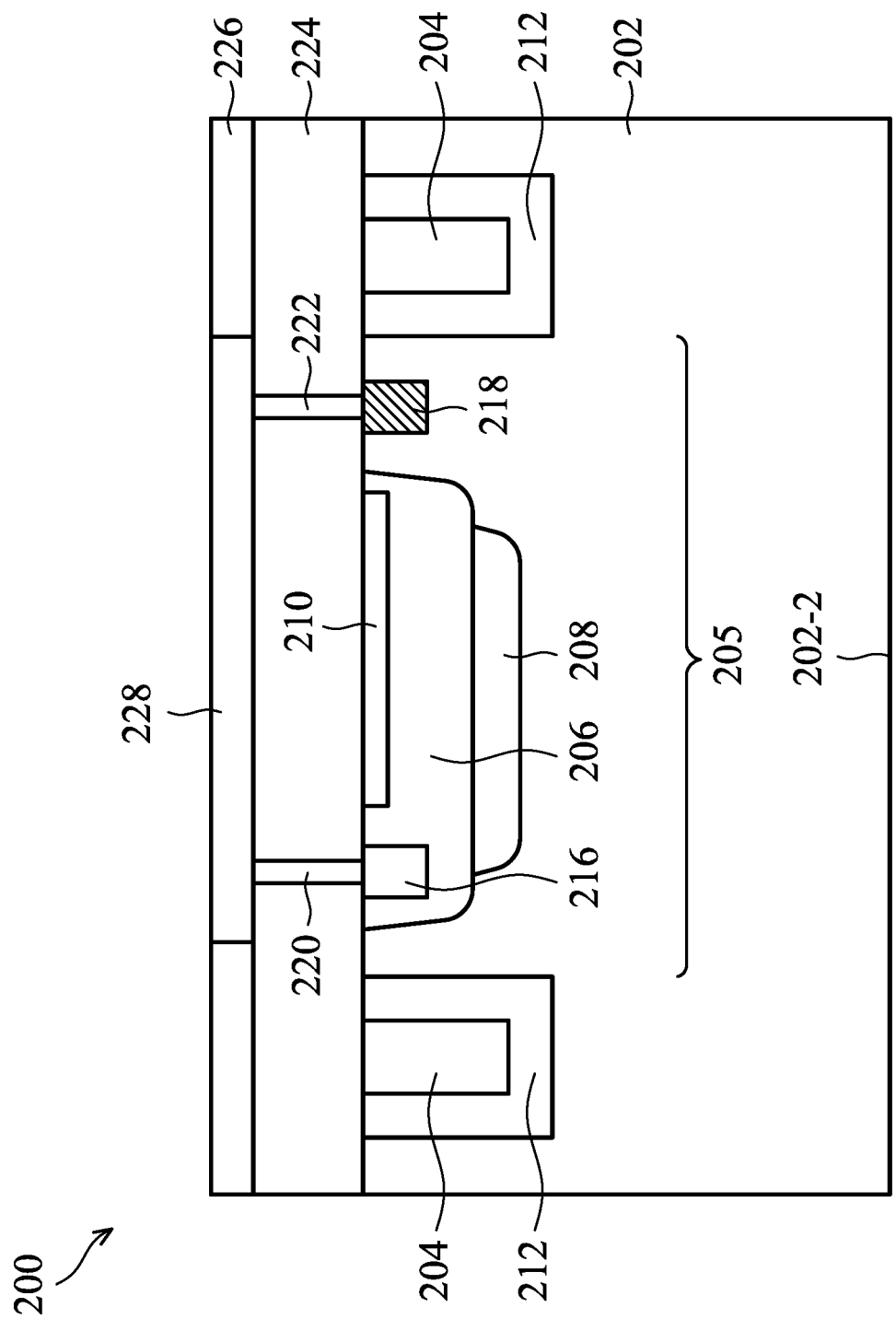

Corresponding to the operation 120 of FIG. 1B, FIG. 2J is a cross-sectional view of the photodetector 200 including at least one dielectric/metal layer 226, which is formed at one of the various stages of fabrication, in accordance with some embodiments. As shown, the dielectric/metal layer 226 is formed above the dielectric layer 224. Accordingly, the dielectric layer 224 and the dielectric/metal layer 226 are herein referred to as an "M0" layer and an "M1" layer, respectively.

In some embodiments, embedded in the M1 layer 226, a conductive reflective layer (or a conductive reflective shield) 228 may be formed directly above the pixel 205. Although in the illustrated embodiment of FIG. 2J, the conductive reflective layer 228 is coupled to the contact plugs 220/222, it is noted that the conductive reflective layer 228 is not necessarily coupled to any of the contact plugs 220/222 while remaining within the scope of the present disclosure.

In some embodiments, the conductive reflective layer 228 may cover an area that is greater than, equal to, or smaller than a lateral area of the pixel 205. As such, in some embodiments, the conductive reflective layer 228 may be configured to reflect at least part of the photons that are incident into the pixel 205 from a back side 202-2 of the substrate 202, which will be discussed in further detail below. In some embodiments, the conductive reflective layer 228 may have a thickness between about and 10 nm and about 200 nm.

In some embodiments, the M1 layer 226 is formed of at least one material selected from the following: silicon oxide, a low dielectric constant (low-k) material, other suitable dielectric material, or a combination thereof. The low-k material may include fluorinated silica glass (FSG), phosphosilicate glass (PSG), borophosphosilicate glass (BPSG), carbon doped silicon oxide ($SiO_xC_y$), strontium oxide (SrO), Black Diamond® (Applied Materials of Santa Clara, Calif.), Xerogel, Aerogel, amorphous fluorinated carbon, Parylene, BCB (bis-benzocyclobutenes), SiLK (Dow Chemical, Midland, Mich.), polyimide, and/or other future developed low-k dielectric materials. The conductive reflective layer 228 is formed of a metal material, e.g., copper (Cu), aluminum (Al), tungsten (W), zinc (Zn), gold (Au), and alloys made thereof.

In some embodiments, the M1 layer 226, including the conductive reflective layer 228, may be formed by at least some of the following processes: using chemical vapor deposition (CVD), physical vapor deposition (PVD), spin-on coating, and/or other suitable techniques to deposit the above-described dielectric material of the M1 layer 226 over the M0 layer 224; performing one or more patterning processes (e.g., a lithography process, a dry/wet etching process, a cleaning process, a soft/hard baking process, etc.) to form an opening through the dielectric material, wherein the opening is aligned with the pixel 205; using CVD, PVD, E-gun, and/or other suitable techniques to deposit the above-described metal material to refill the opening; and polishing out excessive metal material to form the conductive reflective layer 228.

Figure 2K:
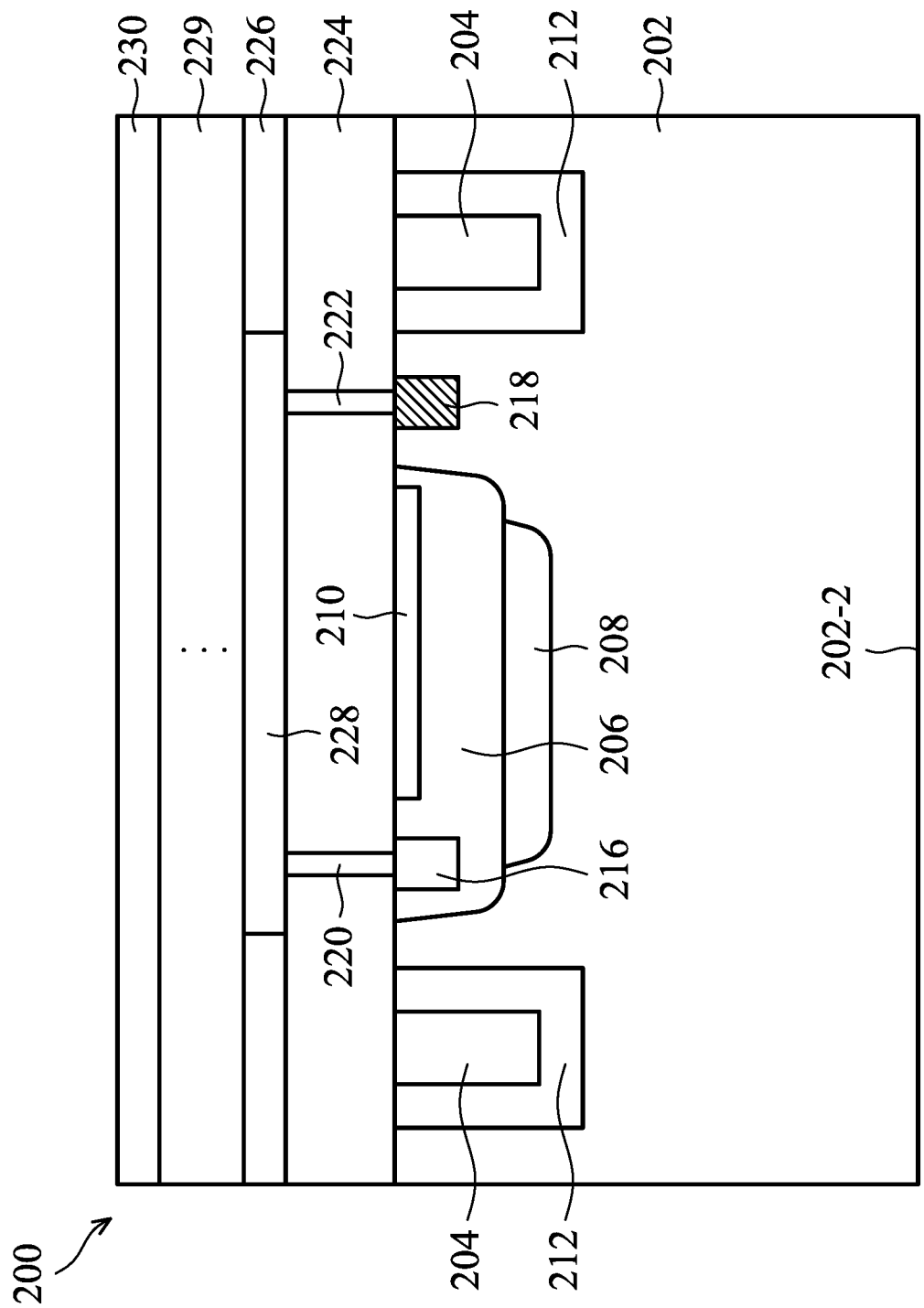

Corresponding to the operation 122 of FIG. 1B, FIG. 2K is a cross-sectional view of the photodetector 200 including a carrier substrate 230, which is formed at one of the various stages of fabrication, in accordance with some embodiments. Although only one dielectric/metal layer (M1 layer) 226 is shown in the illustrated embodiment of FIG. 2J, it is understood that there may be one or more dielectric/metal layers, each of which is substantially similar to 226, are formed above the M1 layer 226 while remaining within the scope of the present disclosure. Such one or more dielectric/metal layers are herein collectively referred to as a dielectric/metal layer 229. In some embodiments, the carrier substrate 230 is formed above the dielectric/metal layer 229.

Further, according to some embodiments, the carrier substrate 230 may be bonded to a top surface of the dielectric/metal layer 290 with a buffer layer (not shown) stacked therebetween. As such, further process steps are allowed to be performed on the back side 202-2 of the substrate 202. In some embodiments, the carrier substrate 230 is bonded to the dielectric/metal layer 290 by molecular forces. The carrier substrate 230 may be similar to the substrate 202, e.g., a silicon substrate. Alternatively, the carrier substrate 230 may optionally include a glass substrate. In some embodiments, the carrier substrate 230 is configured to provide protection for various features formed on the front side 202-2 of the substrate 202. The carrier substrate 230 is further configured to provide mechanical strength and support when the process steps are performed on the back side 202-2 of the substrate 202, which will be discussed below. Optionally, an annealing process may be performed to enhance bonding strength.

Figure 2L:
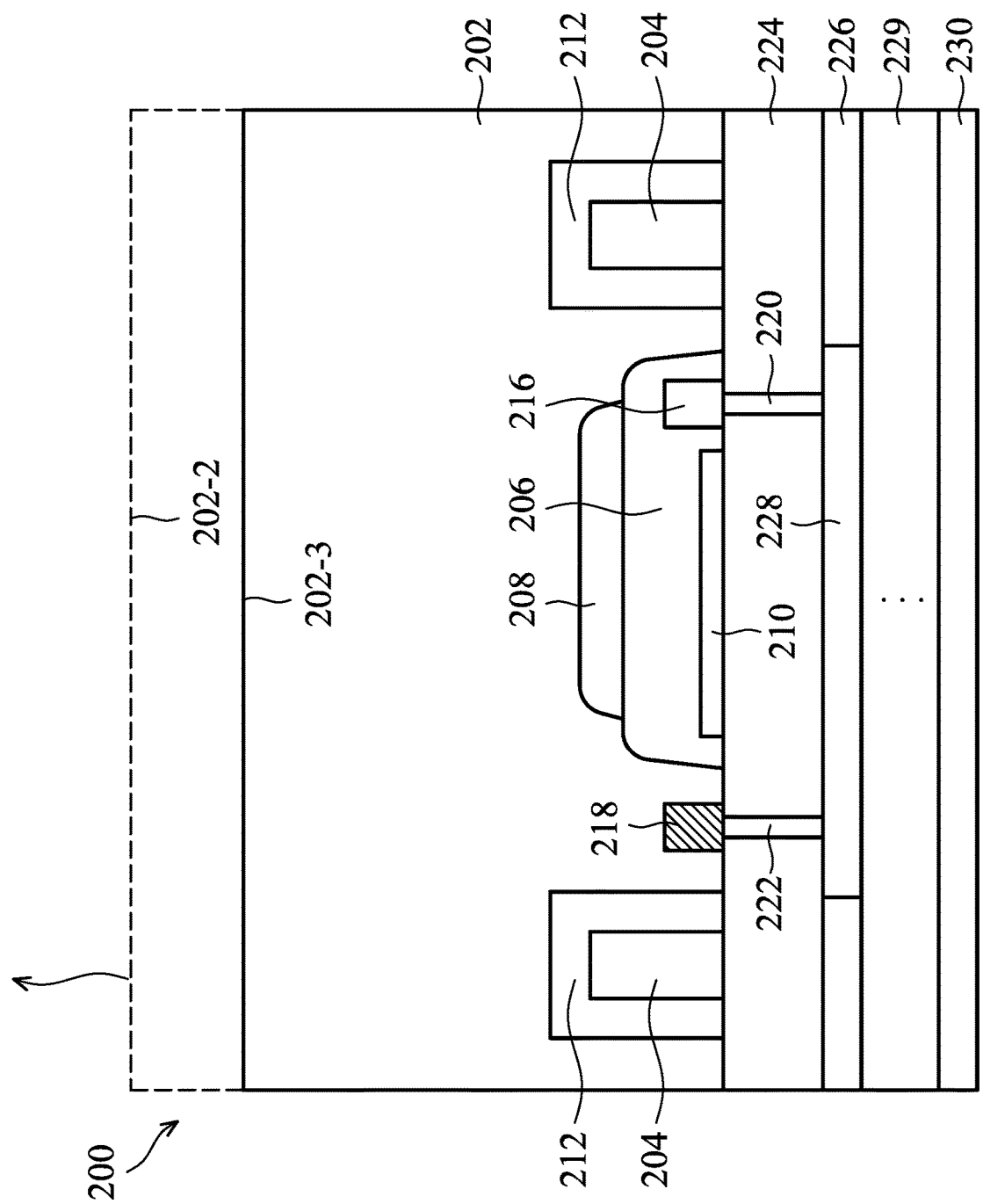

Corresponding to the operation 124 of FIG. 1B, FIG. 2L is a cross-sectional view of the photodetector 200 in which the substrate 202 is flipped and thinned down at one of the various stages of fabrication, in accordance with some embodiments. As shown, the substrate 202 is flipped and thinned down such that a new back side 202-3 of the substrate 202 is exposed. In some embodiments, the thinning down process may be performed by using a chemical-mechanical polishing (CMP) process on the back side 202-2 (shown in dotted line) until the back side 202-3, which is also referred to as a radiation-receiving surface, is exposed. Alternatively, the thinning down process may be performed by using a diamond scrubbing process, a grinding process, or other suitable techniques. In some embodiments, after the thinning down process is performed, the substrate 202 may have a thickness of about 4 micrometers (μm) to about 7 μm that is reduced from an initial thickness of about 100 μm to about 3000 μm.

Figure 2M:
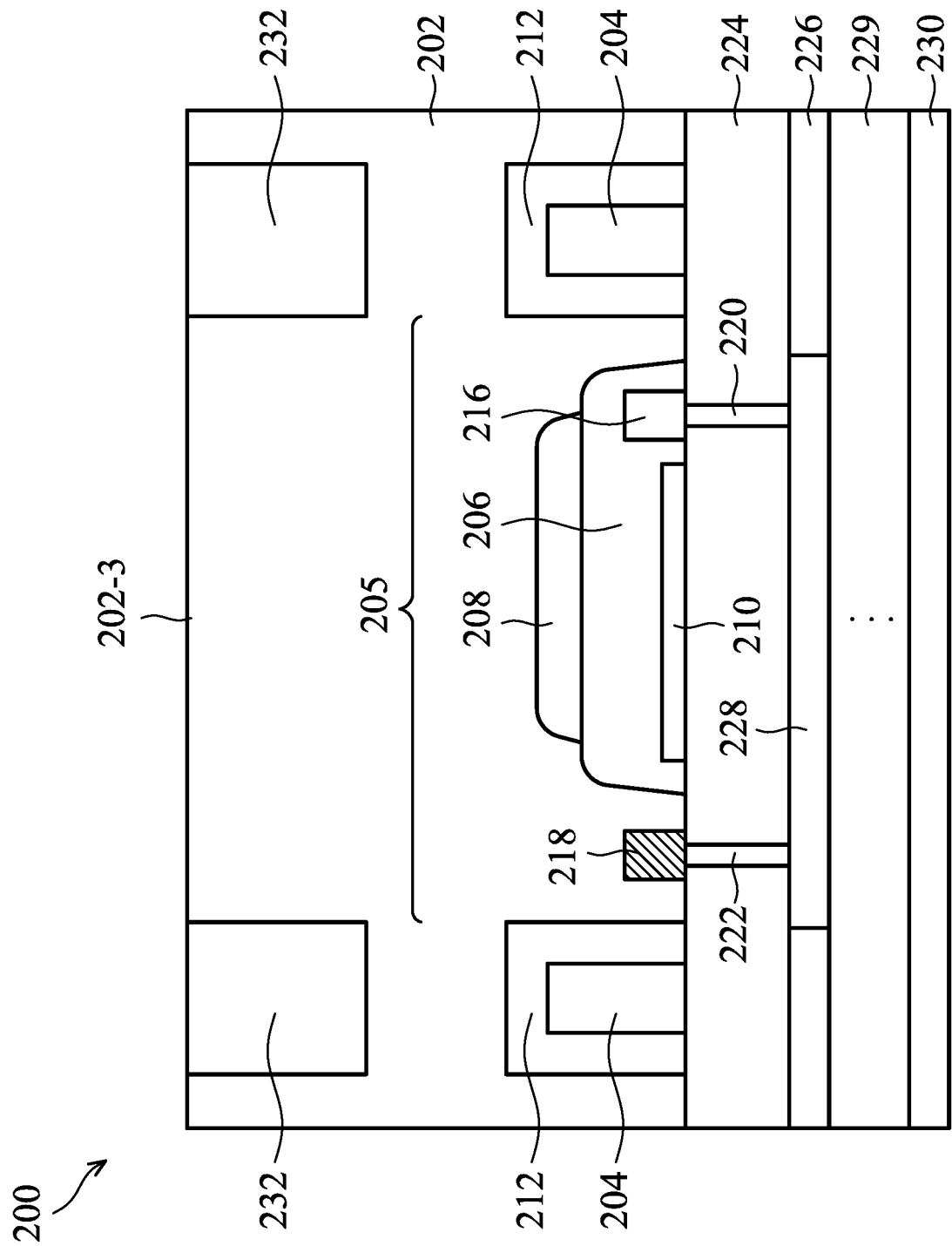
Figure 2N:
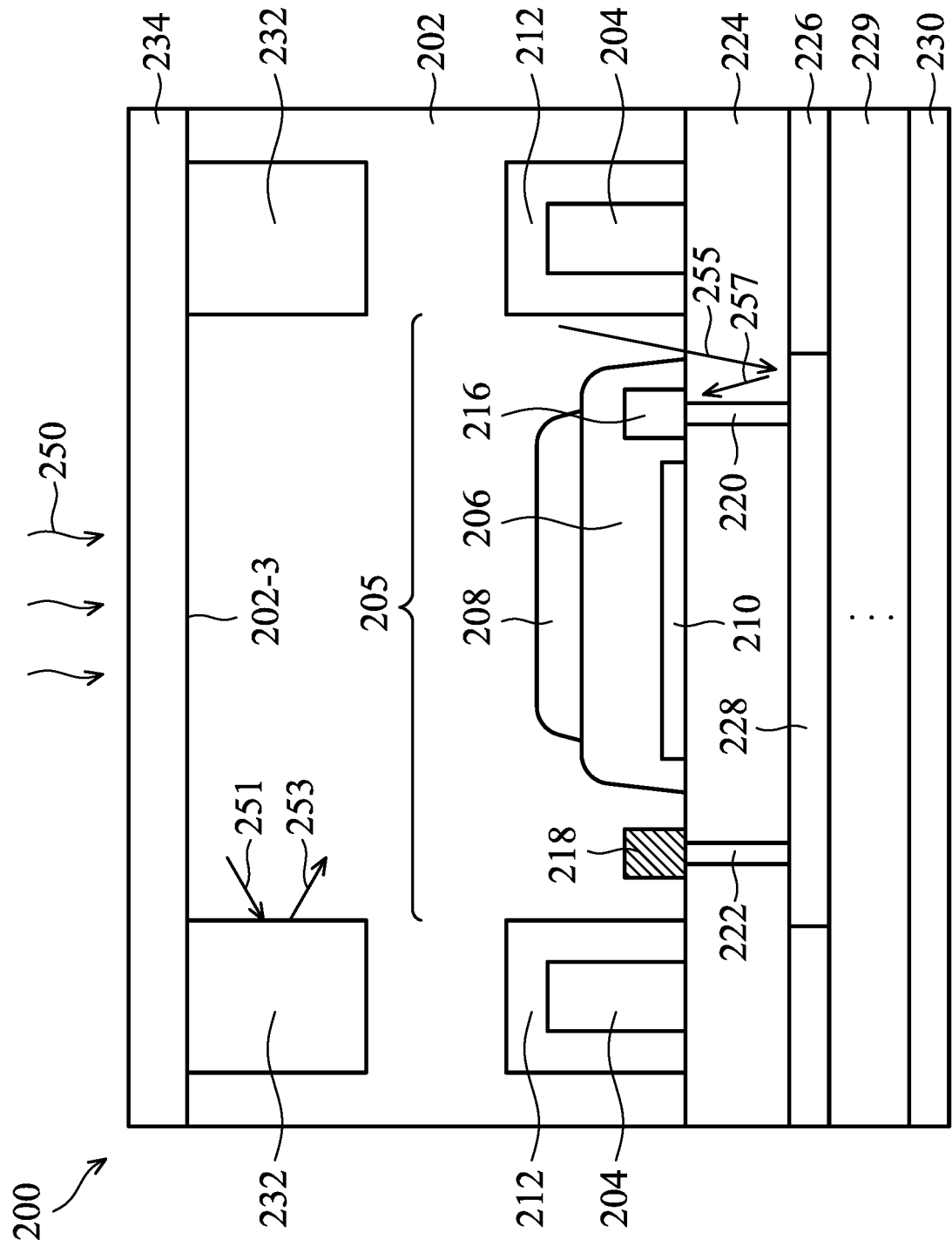

Corresponding to the operation 126 of FIG. 1C, FIG. 2M is a cross-sectional view of the photodetector 200 including a second isolation region 232, which is formed at one of the various stages of fabrication, in accordance with some embodiments. As shown, the second isolation region 232 is formed to extend inwardly into the substrate 202 from the back side 202-3. In some embodiments, when viewing from the top, the second isolation region 232 may be also formed of a ring-like structure to surround the pixel 205. As such, the second isolation region 232 may confine the radiation source that is incident from the back side 202-3 to the pixel 205, or more specifically, to the second semiconductor region 208, as will be discussed below. As mentioned above, the second isolation region 232 may include a deep trench isolation (DTI) feature, according to some embodiments.

In some embodiments, the second isolation region (DTI) 232 may be formed by performing at least some of the following processes: using chemical vapor deposition (CVD), physical vapor deposition (PVD), spin-on coating, and/or other suitable techniques to deposit one or more removable layers (e.g., a photoresist layer, a hardmask layer, etc.) over the back side 202-3 of the substrate 202; performing one or more patterning processes (e.g., a lithography process, a dry/wet etching process, a cleaning process, a soft/hard baking process, etc.) to form an opening through the one or more removable layers; using one or more (dry and/or wet) etching processes with the patterned removable layer(s) serving as a mask to recess an lower portion of the substrate 202; and using CVD, PVD, and/or other suitable techniques to refill the recessed lower portion of the substrate 202 with oxide materials (e.g., silicon oxide).

Corresponding to the operation 128 of FIG. 1C, FIG. 2N is a cross-sectional view of the photodetector 200 including a radiation-receiving dielectric layer 234, which is formed at one of the various stages of fabrication, in accordance with some embodiments. As shown, the radiation-receiving dielectric layer 234 is formed above the back side (radiation-receiving surface) 202-3. In some embodiments, the radiation-receiving dielectric layer 234 may be formed of silicon oxide with a substantially thin thickness (e.g., about 100~300 nm) so as to allow a radiation source 250 to transmit therethrough.

In operation, according to some embodiments, the photodetector 200 is reversely biased somewhat above a respective breakdown voltage (i.e., the Geiger mode), which is in the range of about five to ten volts direct current (about 5 to 10 VDc). Continuing with the above example where the first doping type is p-type and the second doping type is n-type, when the photodetector 200 is reversely biased, a negative voltage difference is present from the second contact region 218/second semiconductor region 208/substrate 202 to the first contact region 216/first semiconductor region 206 (i.e., a voltage applied at the second contact region 218 is lower than a voltage applied at the first contact region 216). In some other embodiments, the photodetector 200 may also operate below the breakdown voltage. In any case, all or substantially all of the second semiconductor region 208, is maintained in a depleted state, i.e., the second semiconductor region 208 is fully depleted, in accordance with some embodiments.

As mentioned above, the radiation-receiving dielectric layer 234 is substantially thin, when the radiation source 250 is received by the radiation-receiving dielectric layer 234, a substantially large number of photons in the radiation source 250 can pass through it and are absorbed in the fully depleted second semiconductor region 208. These photons are absorbed in the second semiconductor region 208, thus generating electron-hole pairs. The electron-hole pairs encounter electric fields established in the second semiconductor region 208, and, through an impact ionization process, generate additional electron hole pairs. This process is repeated to induce an avalanche process. The electron-hole pairs are then collected at the first contact region 216 and the second contact region 218 region, thus creating an electrical output current. It is noted that since the radiation resource 250 is incident from the back side 202-3, most of the photons, including the ones with longer wavelengths, in the radiation resource 250 can be absorbed by the second semiconductor region 208, which advantageously increases the respective PDPs across a wider range of wavelengths.

Moreover, the second isolation region 232 may serve as a "bounding wall" to reflect any photons (e.g., 251) that is not straightly incident to the second semiconductor region 208 back to the second semiconductor region 208 (e.g., a reflected photon 253), which can advantageously decrease a cross-talk between the pixel 205 and a neighboring pixel. Still moreover, in some cases when part of the photons of the radiation source 250 is not absorbed by the second semiconductor region 208 (e.g., 255), the conductive reflective layer 228 may also serve as another bounding wall to reflect it back to the second semiconductor region 208 (e.g., a reflected photon 257). Such a bouncing wall disposed at the opposite side of the radiation-receiving surface 202-3 may be particular useful for photodetectors with smaller pixel sizes and/or for a radiation source with longer wavelengths.

Although, in the above discussions, the first semiconductor region 206, and the first contact region 216 are each doped with the n-type dopants, and the substrate 202, the second semiconductor region 208, the third semiconductor region 210, and the second contact region 218 are each doped with the p-type dopants, it is understood that the polarities of dopants can be reversed (i.e., p-type to n-type, and vice versa) for a desired application. Alternatively stated, in some embodiments, the first semiconductor region 206, and the first contact region 216 can be each doped with the p-type dopants, and the substrate 202, the second semiconductor region 208, the third semiconductor region 210, and the second contact region 218 can be each doped with the n-type dopants while remaining within the scope of the present disclosure. As such, when the photodetector 200 is reversely biased, a positive voltage difference is present from the second contact region 218/second semiconductor region 208/substrate 202 to the first contact region 216/first semiconductor region 206.

Figure 3:
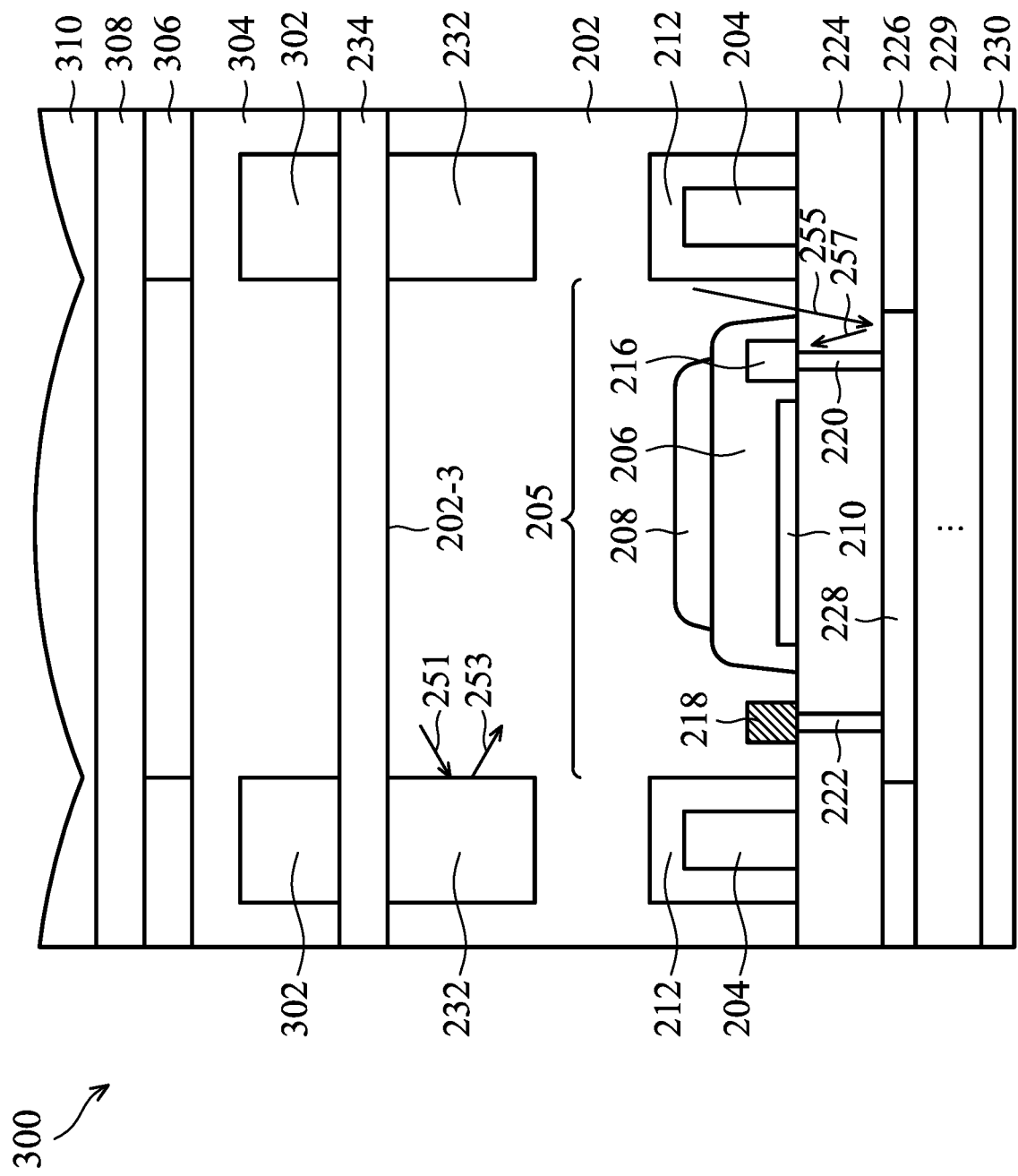
FIG. 3 illustrates a cross-sectional view of another exemplary photodetector device based on the photodetector of FIG. 2N, in accordance with some embodiments.

FIG. 3 illustrates a cross-sectional view of an embodiment of a photodetector 300 that is based on the photodetector 200, in accordance with some embodiments. As shown in FIG. 3, the photodetector 300 is substantially similar to the photodetector 200 except that the photodetector 300 further includes one or more light shields 302, a passivation layer 304, one or more color filters 306, an over-coating layer 308, and one or more dome-shaped microlens 310 respectively formed over the radiation-receiving dielectric layer 234. In some embodiments, the light shields 302, which can be formed of a dielectric material (e.g., oxide), a metal material (e.g., aluminum), and combinations thereof, may be formed as a one-piece grid structure when viewed from the top. More specifically, such a grid structure may have a plurality of hollow areas (i.e., the areas without the light shields 302 being formed thereon), each of which is aligned with a respective pixel (e.g., 205) disposed thereover. As such, the radiation source (e.g., 250 in FIG. 2N) may be better directed to the pixel.

Referring still to FIG. 3, in some embodiments, the passivation layer 304, which can be formed of a dielectric material, may be formed over the light shields 302. Over the passivation layer 304, the color filters 306, each of which may be either a red color filter, or a green color filter, or a blue color filter, are formed. Over the color filters 306, the over-coating layer 308 is formed to provide a planarized surface. Further, over such a planarized surface, the dome-shaped microlens 310 are formed. In some embodiments, each of the dome-shaped microlens 310 may be formed to align with a respective pixel (e.g., 205) disposed thereover such that the radiation source (e.g., 250 in FIG. 2N) can be better directed to the pixel.

In an embodiment, a photodetector includes: a substrate having a first doping type; a first semiconductor region having a second doping type, the first semiconductor region extending into the substrate from a front side of the substrate; and a second semiconductor region having the first doping type, the second semiconductor region further extending into the substrate from a bottom boundary of the first semiconductor region, wherein when the photodetector operates under a Geiger mode, the second semiconductor region is fully depleted to absorb a radiation source received from a back side of the substrate.

In another embodiment, a photodetector includes: a substrate having a first doping type; a first semiconductor region having a second doping type opposite to the first doping type, the first semiconductor region extending into the substrate from a front side of the substrate; a second semiconductor region having the first doping type, the second semiconductor region further extending into the substrate from a bottom boundary of the first semiconductor region; and a first isolation region extending into the substrate from a back side of the substrate, wherein the first isolation region surrounds the first and second semiconductor regions so as to confine an incident radiation source to the second semiconductor region.

Yet in another embodiment, a method includes: forming a first semiconductor region over a front side of a substrate, wherein the first semiconductor region has a first doping type; forming a second semiconductor region inwardly extends into the substrate from a bottom boundary of the first semiconductor region, wherein the second semiconductor region has a second doping top opposite to the first doping type; and thinning the substrate from a back side of the substrate so as to form a radiation receiving surface on the back side of the substrate.

The foregoing outlines features of several embodiments so that those ordinary skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A photodetector, comprising:
a substrate;
a first semiconductor region, the first semiconductor region extending into the substrate from a front side of the substrate; and
a second semiconductor region, the second semiconductor region further extending into the substrate from a bottom boundary of the first semiconductor region,
wherein when the photodetector operates under a Geiger mode,
the second semiconductor region is fully depleted to absorb a radiation source received from a back side of the substrate, and
a negative voltage is present from the substrate to the first semiconductor region.

2. The photodetector of claim 1, wherein:
the substrate has a first doping type; and
the first semiconductor region has a second doping type opposite to the first doping type.

3. The photodetector of claim 1, further comprising:
a conductive reflection layer disposed over the front side of the substrate.

4. The photodetector of claim 3, wherein the conductive reflective layer is embedded within a dielectric layer disposed directly above the front side of the substrate.

5. The photodetector of claim 1, further comprising:
a first isolation region extending into the substrate from the back side of the substrate, wherein the first isolation region surrounds the first and second semiconductor regions.

6. The photodetector of claim 5, further comprising:
a second isolation region extending into the substrate from the front side of the substrate, wherein the second isolation region surrounds the first and second semiconductor regions.

7. The photodetector of claim 6, wherein the first isolation region comprises a deep trench isolation (DTI) feature, and the second isolation region comprises a shallow trench isolation (STI) feature.

8. The photodetector of claim 6, further comprising:
a semiconductor well extending into the substrate from the front side of the substrate, wherein the semiconductor well surrounds the second isolation region.

9. A photodetector, comprising:
a substrate having a first doping type;
a first semiconductor region having a second doping type opposite to the first doping type, the first semiconductor region extending into the substrate from a front side of the substrate;
a second semiconductor region, the second semiconductor region further extending into the substrate from a bottom boundary of the first semiconductor region;
a first isolation region extending into the substrate from a back side of the substrate; and
a second isolation region extending into the substrate from the front side of the substrate.

10. The photodetector of claim 9, wherein:
the first isolation region surrounds the first and second semiconductor regions so as to confine an incident radiation source to the second semiconductor region; and
the incident radiation source is received from the back side of the substrate.

11. The photodetector of claim 10, wherein when the photodetector operates under a Geiger mode, the second semiconductor region is configured to be fully depleted to absorb the incident radiation source.

12. The photodetector of claim 11, wherein when the photodetector operates under the Geiger mode, a negative voltage is present from the substrate to the first semiconductor region.

13. The photodetector of claim 9, further comprising:
a conductive reflection layer disposed over the front side of the substrate.

14. The photodetector of claim 13, wherein the conductive reflective layer is embedded within a dielectric layer disposed directly above the front side of the substrate.

15. The photodetector of claim 9, wherein:
the second isolation region surrounds the first and second semiconductor regions.

16. The photodetector of claim 15, wherein the first isolation region comprises a deep trench isolation (DTI) feature, and the second isolation region comprises a shallow trench isolation (STI) feature.

17. The photodetector of claim 15, further comprising:
a semiconductor well extending into the substrate from the front side of the substrate, wherein the semiconductor well surrounds the second isolation region.

18. A method for forming a photodetector, comprising:
forming a first semiconductor region over a front side of a substrate;
forming a second semiconductor region inwardly extends into the substrate from a bottom boundary of the first semiconductor region; and
thinning the substrate from a back side of the substrate so as to form a radiation receiving surface on the back side of the substrate,
wherein when the photodetector operates under a Geiger mode,
the second semiconductor region is fully depleted to absorb a radiation source received from the radiation receiving surface, and
a negative voltage is present from the substrate to the first semiconductor region.

19. The method of claim 18, further comprising:
forming a conductive reflective layer embedded within a dielectric layer disposed directly above the front side of the substrate.

* * * * *